(12) United States Patent
Ishida et al.

(10) Patent No.: US 11,574,681 B2
(45) Date of Patent: Feb. 7, 2023

(54) SEMICONDUCTOR STORAGE DEVICE HAVING VOLTAGE ERASING OPERATION CAPABILITY AND CONTROL METHOD THEREOF

(71) Applicant: Kioxia Corporation, Tokyo (JP)

(72) Inventors: Takashi Ishida, Yokkaichi Mie (JP); Hiroshi Kanno, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/190,856

(22) Filed: Mar. 3, 2021

(65) Prior Publication Data

US 2021/0391011 A1 Dec. 16, 2021

(30) Foreign Application Priority Data

Jun. 15, 2020 (JP) .............................. JP2020-103218

(51) Int. Cl.
| | | |
|---|---|---|
| *G11C 16/14* | (2006.01) | |
| *G11C 16/04* | (2006.01) | |
| *G11C 16/30* | (2006.01) | |
| *G11C 16/08* | (2006.01) | |
| *G11C 16/24* | (2006.01) | |

(52) U.S. Cl.
CPC .......... *G11C 16/0483* (2013.01); *G11C 16/08* (2013.01); *G11C 16/14* (2013.01); *G11C 16/24* (2013.01); *G11C 16/30* (2013.01)

(58) Field of Classification Search
CPC ..... G11C 16/0483; G11C 16/08; G11C 16/14; G11C 16/24; G11C 16/30; G11C 16/32
See application file for complete search history.

(56) References Cited

U.S. PATENT DOCUMENTS

| | | | |
|---|---|---|---|
| 5,432,738 A * | 7/1995 | Watsuji ................ | G11C 16/26 365/185.26 |
| 8,724,391 B2 | 5/2014 | Nakamura et al. | |
| 9,361,988 B2 | 6/2016 | Shirakawa et al. | |
| 10,381,083 B1 * | 8/2019 | Yang .................... | G11C 16/16 |
| 2002/0057600 A1 * | 5/2002 | Sakui .................... | G11C 16/16 365/185.27 |
| 2008/0013360 A1 * | 1/2008 | Hemink ............ | G11C 16/0483 365/100 |
| 2013/0308386 A1 * | 11/2013 | Iwai .................... | H01L 29/7926 365/185.17 |
| 2016/0372204 A1 * | 12/2016 | Lee ........................ | G11C 16/16 |
| 2018/0182461 A1 * | 6/2018 | Lee ........................ | G11C 16/08 |
| 2020/0211650 A1 * | 7/2020 | Lee .................... | G11C 16/3427 |
| 2022/0076756 A1 * | 3/2022 | Lee ........................ | G11C 16/08 |

FOREIGN PATENT DOCUMENTS

| | | | |
|---|---|---|---|
| JP | 2013-080535 A | 5/2013 | |
| JP | 2015-176624 A | 10/2015 | |

* cited by examiner

*Primary Examiner* — Khamdan N. Alrobaie
(74) *Attorney, Agent, or Firm* — Foley & Lardner LLP (57) ABSTRACT

A semiconductor storage device includes a plurality of memory cell transistors, a first wiring electrically connected to the plurality of memory cell transistors, and an erasing circuitry. The erasing circuitry is configured to erase data stored in the memory cell transistors by applying a first voltage to the first wiring, and apply the first voltage such that the first voltage rises to a first value, then falls from the first value to a second value, and is then maintained at the second value.

24 Claims, 7 Drawing Sheets

SEMICONDUCTOR STORAGE DEVICE HAVING VOLTAGE ERASING OPERATION CAPABILITY AND CONTROL METHOD THEREOF

CROSS-REFERENCE TO RELATED APPLICATION(S)

This application is based upon and claims the benefit of priority from Japanese Patent Application No. 2020-103218, filed Jun. 15, 2020, the entire contents of which are incorporated herein by reference.

FIELD

Embodiments described herein relate generally to a semiconductor storage device and a control method thereof.

BACKGROUND

In a semiconductor storage device, it is desirable to improve reliability of an erasing operation for a memory cell transistor.

DETAILED DESCRIPTION

Embodiments provide a semiconductor storage device capable of improving reliability of an erasing operation for a memory cell transistor and a control method thereof.

In general, according to one embodiment, the semiconductor storage device includes a first wiring that is electrically connected to a plurality of memory cell transistors. The device further includes an erasing circuitry that erases data stored in the memory cell transistors by applying a first voltage to the first wiring. The erasing circuitry applies the first voltage such that the first voltage rises to a first value, falls from the first value to a second value, and is maintained at the second value.

Hereinafter, embodiments of the present disclosure will be described with reference to the drawings. In FIG. 1 to FIG. 8, the same components are denoted by the same reference numerals, and a repetitive description thereof will be omitted.

First Embodiment

Figure 1:
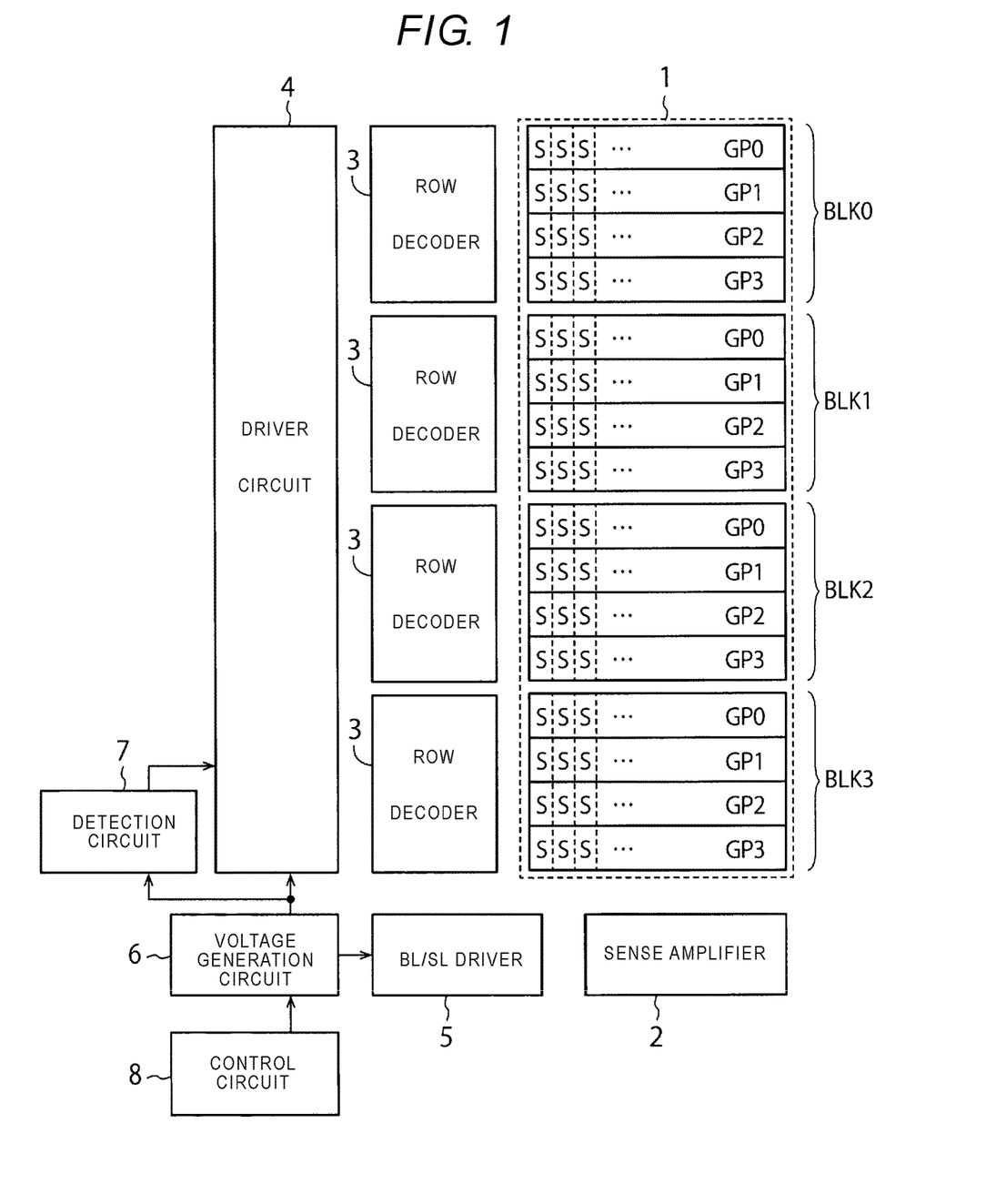
FIG. 1 is a block diagram showing a configuration of a semiconductor storage device according to a first embodiment.

FIG. 1 is a block diagram showing a configuration of a semiconductor storage device according to a first embodiment. The semiconductor storage device of the present embodiment is, for example, a three-dimensional NAND memory.

The semiconductor storage device of the present embodiment includes a memory cell array 1, a sense amplifier 2, a plurality of row decoders 3, a driver circuit 4, a BL/SL driver 5, a voltage generation circuit 6, a detection circuit 7, and a control circuit 8. The driver circuit 4, the BL/SL driver 5, the voltage generation circuit 6, the detection circuit 7, or the like are examples of an erasing circuitry.

The memory cell array 1 includes a plurality of (here, 4) blocks BLK0 to BLK3, and each of these blocks BLK0 to BLK3 includes a plurality of (here, four) memory groups GP0 to GP3. Further, each of these memory groups GP0 to GP3 includes a plurality of NAND strings S. Each NAND string S includes a plurality of memory cell transistors (memory cells) connected in series with each other, and two select transistors (select gates) that sandwich these memory cell transistors therebetween. Hereinafter, each of the blocks BLK0 to BLK3 is also referred to as a "block BLK", and each of the memory groups GP0 to GP3 is also referred to as a "memory group GP".

The memory cell array 1 can store data in the memory cells of each NAND string S. The data stored in the memory cells are collectively erased for each block BLK. The number of the blocks BLK in the memory cell array 1 is four in the present embodiment and may be other than four. Similarly, the number of the memory group GPs in each block BLK is four in the present embodiment and may be other than four.

When the sense amplifier 2 reads data from the memory cell array 1, the sense amplifier 2 detects and amplifies the read data. Further, when writing data to the memory cell array 1, the sense amplifier 2 transfers the write data to the memory cell array 1.

Each row decoder 3 corresponds to one block BLK. The semiconductor storage device of the present embodiment includes four row decoders 3 corresponding to the four blocks BLK. Each row decoder 3 selects a row in a corresponding block BLK when reading or writing data.

The driver circuit 4 supplies each row decoder 3 with a voltage required for reading, writing, and erasing data. The voltage is applied to the memory cells by each row decoder 3.

The BL/SL driver 5 applies the voltage required for reading, writing, and erasing data to a bit line and/or a source line described later. For example, the BL/SL driver 5 applies an erasing voltage $V_{ERA}$ to the bit line and/or the source line when erasing data stored in the memory cell array 1.

The voltage generation circuit 6 generates the voltage required for reading, writing, and erasing data and supplies the voltage to the driver circuit 4 and the BL/SL driver 5. For example, the voltage generation circuit 6 generates the erasing voltage $V_{ERA}$ when erasing data.

The detection circuit 7 monitors the erasing voltage $V_{ERA}$ generated from the voltage generation circuit 6 when erasing data. The detection circuit 7 further controls the driver circuit 4 by generating a flag signal according to a value of the erasing voltage $V_{ERA}$.

The control circuit 8 controls an operation of the semiconductor storage device of the present embodiment. The control circuit 8 controls an operation of the voltage generation circuit 6 when reading, writing, and erasing data, for example, to generate the voltage required for reading, writing, and erasing data.

Figure 2:
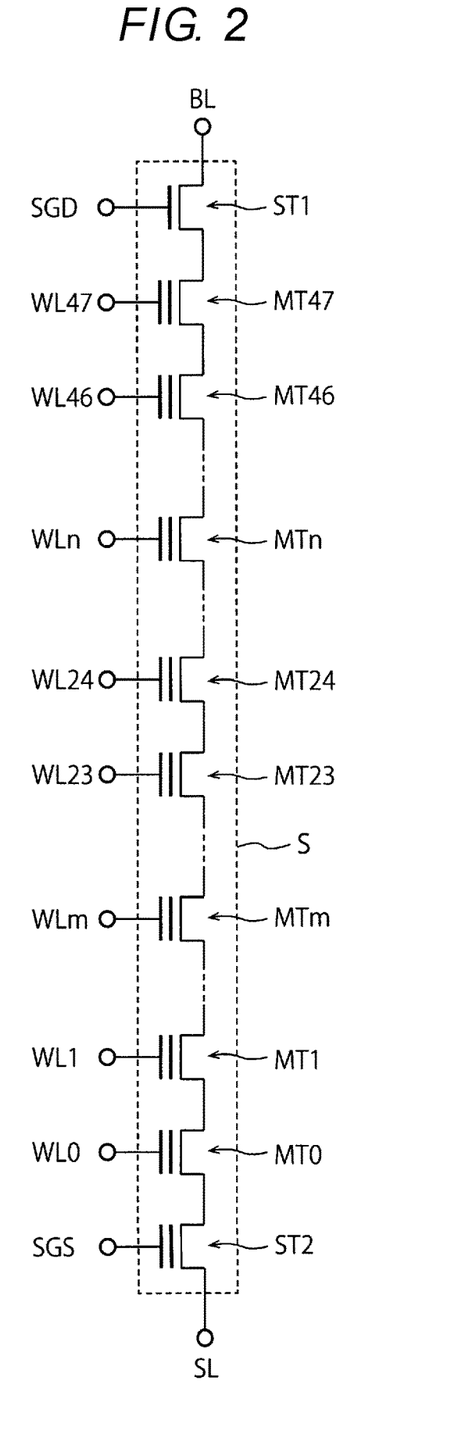
FIG. 2 is a circuit diagram showing a configuration of a NAND string according to the first embodiment.

FIG. 2 is a circuit diagram showing a configuration of the NAND string S according to the first embodiment.

FIG. 2 shows one NAND string S in the memory cell array 1. The NAND string S shown in FIG. 2 includes a plurality of memory cell transistors MT0 to MT47 (here, 48) connected in series with each other, and two select transistors ST1 and ST2 that sandwich these memory cell transistors MT0 to MT47 therebetween. One main terminal of the select transistor ST1 is electrically or directly connected to the memory cell transistor MT47, and the other main terminal of the select transistor ST1 is electrically or directly connected to a bit line BL. One main terminal of the select transistor ST2 is electrically or directly connected to the memory cell transistor MT0, and the other main terminal of the select transistor ST2 is electrically or directly connected to a source line SL. Hereinafter, each of the memory cell transistors MT0 to MT47 is also referred to as a "memory cell transistor MT", and each of the select transistors ST1 and ST2 is also referred to as a "select transistor ST".

As shown in FIG. 2, the memory cell array 1 further includes a plurality of word lines WL0 to WL47 (here, 48) electrically or directly connected to control terminals (gate terminals) of the memory cell transistors MT0 to MT47, a drain side select line SGD electrically or directly connected to a control terminal of the select transistor ST1, and a source side select line SGS electrically or directly connected to a control terminal of the select transistor ST2. The memory cell array 1 further includes the above bit line BL and the source line SL. The bit line BL and the source line SL are examples of a first wiring. The source side select line SGS and the drain side select line SGD are examples of a second wiring. Hereinafter, each of the word lines WL0 to WL47 is also referred to as a "word line WL".

The word line WL is electrically or directly connected to a corresponding memory cell transistor MT and is provided in order to control an operation of the corresponding memory cell transistor MT. The drain side select line SGD is provided in order to control an operation of the select transistor ST1. The source side select line SGS is provided in order to control an operation of the select transistor ST2.

The bit line BL is electrically connected to the memory cell transistors MT0 to MT47 via the select transistor ST1. The source line SL is electrically connected to the memory cell transistors MT0 to MT47 via the select transistor ST2. The bit line BL and the source line SL are used, for example, for reading, writing, and erasing data for the memory cell transistors MT0 to MT47.

FIG. 2 shows the memory cell transistors MT0, MT1, . . . MTm, . . . MT23, MT24, . . . MTn, . . . MT46, and MT47, in which m is an optional integer satisfying 1<m<23 and n is an optional integer satisfying 24<n<46. FIG. 2 further shows the word lines WL0, WL1, . . . WLm, . . . WL23, WL24, . . . WLn, . . . WL46, and WL47 and m and n will be used in a description of FIG. 3 described later.

Figure 3:
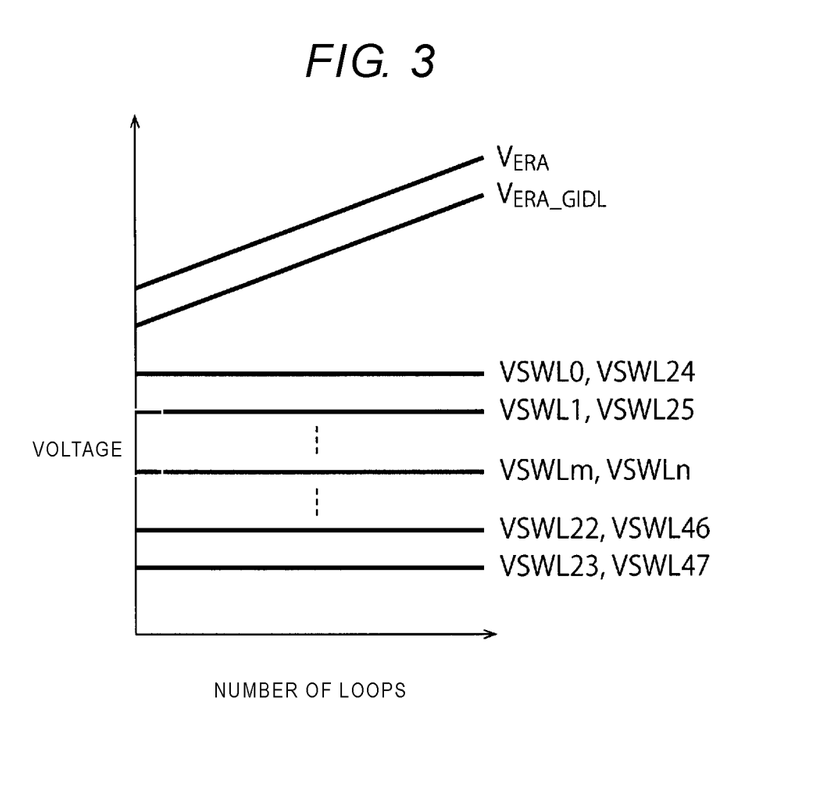
FIG. 3 is a graph showing an erasing operation according to the first embodiment.

FIG. 3 is a graph showing an erasing operation according to the first embodiment.

FIG. 3 shows various voltages used in the erasing operation of the semiconductor storage device of the present embodiment. Specifically, FIG. 3 shows the voltage (the erasing voltage) $V_{ERA}$ applied to the source line SL, a voltage $V_{ERA\_GIDL}$ applied to the source side select line SGS, and voltages VSWL0 to VSWL47 applied to the word lines WL0 to WL47. The erasing voltage $V_{ERA}$ is an example of a first voltage. The voltage $V_{ERA\_GIDL}$ is an example of a second voltage. Hereinafter, each of the voltages VSWL0 to VSWL47 is also referred to as a "voltage VSWL".

The erasing voltage $V_{ERA}$ is generated by the voltage generation circuit 6 (see FIG. 1, the same applies hereinafter) and is applied to the source line SL by the BL/SL driver 5. The voltage $V_{ERA\_GIDL}$ is generated by the voltage generation circuit 6 and applied to the source side select line SGS by the driver circuit 4 and the row decoders 3. The voltages VSWL0 to VSWL47 are generated by the voltage generation circuit 6 and applied to the word lines WL0 to WL47 by the driver circuit 4 and the row decoders 3. As shown in FIG. 3, values of these voltages are set such that a relationship of $V_{ERA}$>$V_{ERA\_GIDL}$>VSWL0=VSWL24>VSWL1=VSWL25> . . . >VSWLm=VSWLn . . . >VSWL22=VSWL46>VSWL23=VSWL47 is established.

In the present embodiment, data stored in the memory cell transistors MT is collectively erased for each block BLK. Specifically, the semiconductor storage device of the present embodiment applies the erasing voltage $V_{ERA}$ to the source line SL connected to a certain NAND string S when collectively erasing data from all the memory cell transistors MT of the NAND string S.

At this time, the semiconductor storage device of the present embodiment applies the voltage $V_{ERA\_GIDL}$ to the source side select line SGS connected to the NAND string S. As a result, a gate induced drain leakage (GIDL) current is generated in a channel region of the select transistor ST2. The GIDL current flows from a source line SL side to a memory cell transistor MT side. The data stored in each memory cell transistors MT is erased by the GIDL current. During the erasing operation, the voltages VSWL0 to VSWL47 are applied to the word lines WL0 to WL47.

In the semiconductor storage device of the present embodiment, during the erasing operation, one or more erasing verification operations and one or more erasing voltage application operations are alternately repeated. In the erasing voltage application operation, the erasing voltage $V_{ERA}$ is applied to the source line SL, the voltage $V_{ERA\_GIDL}$ is applied to the source side select line SGS, and the voltages VSWL are applied to each word line WL. The number of loops shown in FIG. 3 indicates the number of times the erasing voltage application operation is performed. In the present embodiment, the erasing voltage $V_{ERA}$ and the voltage $V_{ERA\_GIDL}$ increase linearly according to the number of the loops. On the other hand, the voltages VSWL are constant regardless of the number of the loops.

Figure 4:
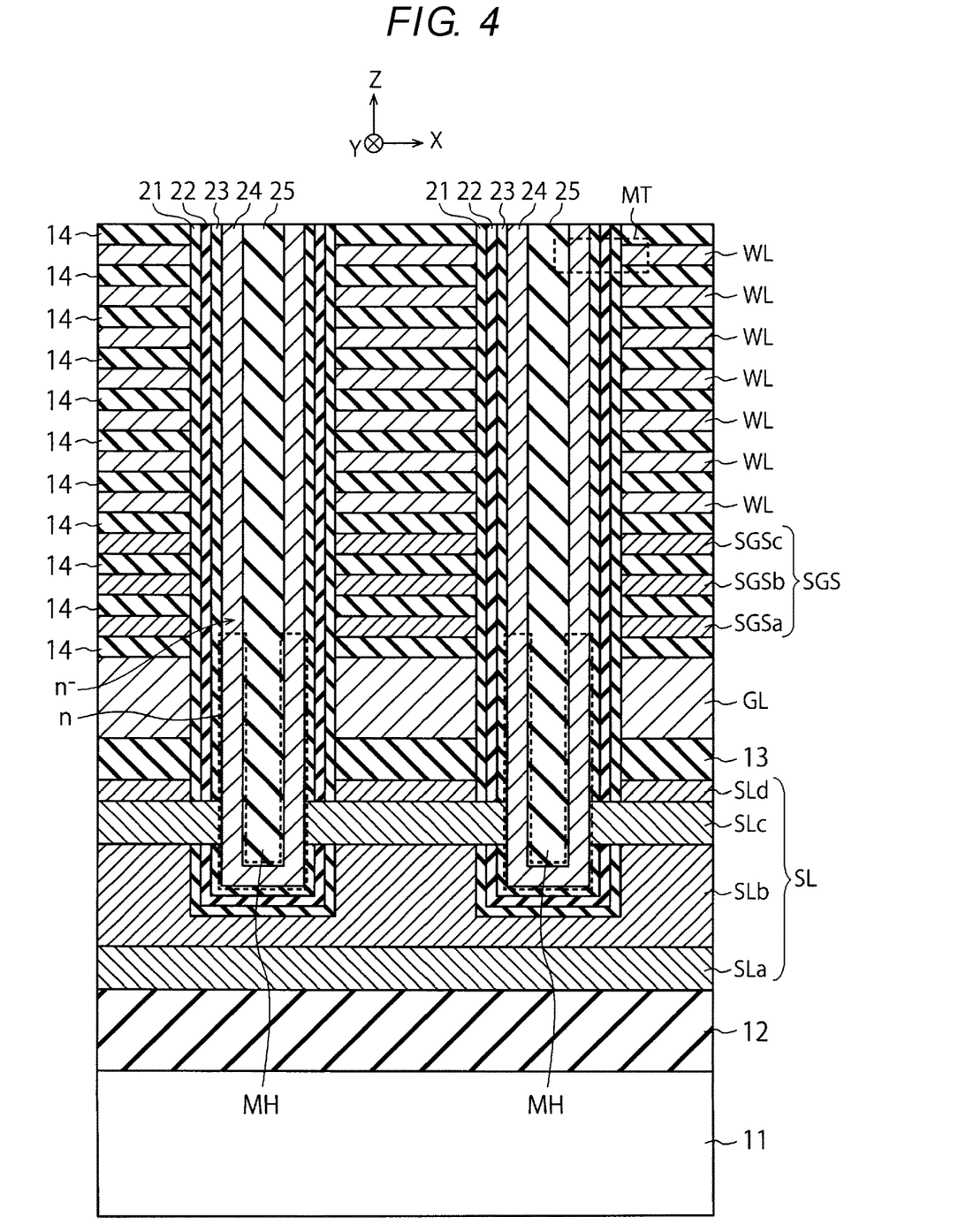
FIG. 4 is a cross-sectional view showing a structure of the semiconductor storage device according to the first embodiment.

FIG. 4 is a cross-sectional view showing a structure of the semiconductor storage device according to the first embodiment.

The semiconductor storage device of the present embodiment includes a substrate 11, an interlayer insulating film 12, an interlayer insulating film 13, a plurality of insulating layers 14, and a plurality of memory holes MHs. FIG. 4 shows two of the memory holes MHs. The semiconductor storage device of the present embodiment further includes a block insulating film 21, a charge storage layer 22, a tunnel insulating film 23, a channel semiconductor layer 24, and a core insulating film 25, which are sequentially formed in each memory hole MH. The channel semiconductor layer 24 is an example of a semiconductor layer.

The semiconductor storage device of the present embodiment further includes the source line SL, a gate line GL, the source side select line SGS, and the plurality of word lines WLs as a plurality of wiring layers formed on the substrate 11. The source line SL includes a metal layer SLa, a lower semiconductor layer SLb, an intermediate semiconductor layer SLc, and an upper semiconductor layer SLd. The source side select line SGS includes three wiring layers SGSa, SGSb, and SGSc.

The substrate 11 is, for example, a semiconductor substrate such as a silicon substrate. FIG. 4 shows an X direction and a Y direction, which are perpendicular to each other and parallel with a surface of the substrate 11, and a Z direction that is perpendicular to the surface of the substrate 11. In this specification, a +Z direction is taken as an upward direction and a −Z direction is taken as a downward direction. The −Z direction may or may not coincide with a gravity direction.

The interlayer insulating film 12 is formed on the substrate 11. The interlayer insulating film 12 is, for example, a silicon oxide film. The interlayer insulating film 12 may be formed directly on the substrate 11 or may be formed on the substrate 11 via another layer.

The source line SL includes the metal layer SLa, the lower semiconductor layer SLb, the intermediate semiconductor layer SLc, and the upper semiconductor layer SLd, which are sequentially formed on the interlayer insulating film 12. The metal layer SLa is, for example, a tungsten layer. The lower semiconductor layer SLb, the intermediate semiconductor layer SLc, and the upper semiconductor layer SLd are, for example, polysilicon layers. The intermediate semiconductor layer SLc of the present embodiment is in contact with the channel semiconductor layer 24 in each memory hole MH. Accordingly, the source line SL is electrically or directly connected to the channel semiconductor layer 24 in each memory hole MH.

The interlayer insulating film 13 is formed on the source line SL. The interlayer insulating film 13 is, for example, a silicon oxide film.

The gate line GL is formed on the interlayer insulating film 13. The gate line GL is, for example, a polysilicon layer.

As described above, the source side select line SGS includes the three wiring layers SGSa, SGSb, and SGSc. The wiring layers SGSa to SGSc are stacked above the gate line GL to be separated from each other. The plurality of insulating layers 14 are provided between the wiring layers SGSa to SGSc. Similarly, the plurality of word lines WLs described above are stacked above the source side select line SGS to be separated from each other. The plurality of insulating layers 14 are provided between the word lines WLs. Each insulating layer 14 includes, for example, a silicon oxide film. Each of the wiring layers SGSa to SGSc includes, for example, a tungsten layer. Each word line WL includes, for example, a tungsten layer.

Each memory hole MH penetrates each insulating layer 14, each word line WL, the wiring layers SGSa to SGSc of the source side select line SGS, the gate line GL, and the interlayer insulating film 13. A part of each memory hole MH is formed in the source line SL. The block insulating film 21, the charge storage layer 22, the tunnel insulating film 23, the channel semiconductor layer 24, and the core insulating film 25 are sequentially formed in each memory hole MH. The block insulating film 21 is, for example, a silicon oxide film. The charge storage layer 22 is, for example, a silicon nitride film. The charge storage layer 22 may be a polysilicon layer. The tunnel insulating film 23 is, for example, a silicon oxide film. The channel semiconductor layer 24 is, for example, a polysilicon layer. The channel semiconductor layer 24 of the present embodiment is electrically or directly connected to the source line SL and is electrically isolated from the gate line GL, the source side select line SGS, and each word line WL. The core insulating film 25 is, for example, a silicon oxide film.

The block insulating film 21, the charge storage layer 22, the tunnel insulating film 23, the channel semiconductor layer 24, and the core insulating film 25 in each memory hole MH form the NAND string S (see FIG. 2) together with the above-mentioned plurality of word lines WLs. In FIG. 4, one memory cell transistor MT in the NAND string S is shown by a dotted line.

As shown in FIG. 4, the channel semiconductor layer 24 of the present embodiment includes an n type diffusion layer on a side of the source line SL or the gate line GL. The n type diffusion layer includes n type impurities at a high concentration. As shown in FIG. 4, the channel semiconductor layer 24 of the present embodiment further includes an n− type diffusion layer on a side of the wiring layer SGSa in the source side select line SGS. The n− type diffusion layer is located above the n type diffusion layer and includes n type impurities such that a concentration of the n type impurities changes sharply in the Z direction. In the present embodiment, the GIDL current can be generated by an action of this n− type diffusion layer.

In the semiconductor storage device of the present embodiment, the erasing voltage $V_{ERA}$ is applied to the source line SL, and the voltage $V_{ERA\_GIDL}$ is applied to the source side select line SGS to generate the GIDL current in the channel region of the select transistor ST2. The n− type diffusion layer shown in FIG. 4 is provided in the channel region of the select transistor ST2. The data stored in the memory cell transistor MT shown in FIG. 4 is erased by the GIDL current. In FIG. 4, the source line SL is an example of the first wiring, and the source side select line SGS is an example of the second wiring.

In this case, when a concentration profile of the n type impurities in the n− type diffusion layer is significantly different for each memory hole MH, an amount of the GIDL current generated will be significantly different for each memory hole MH. Accordingly, reliability of the erasing operation of the present embodiment may decrease. Therefore, the semiconductor storage device of the present embodiment employs the erasing operation as described with reference to FIG. 6 to FIG. 8.

Figure 5:
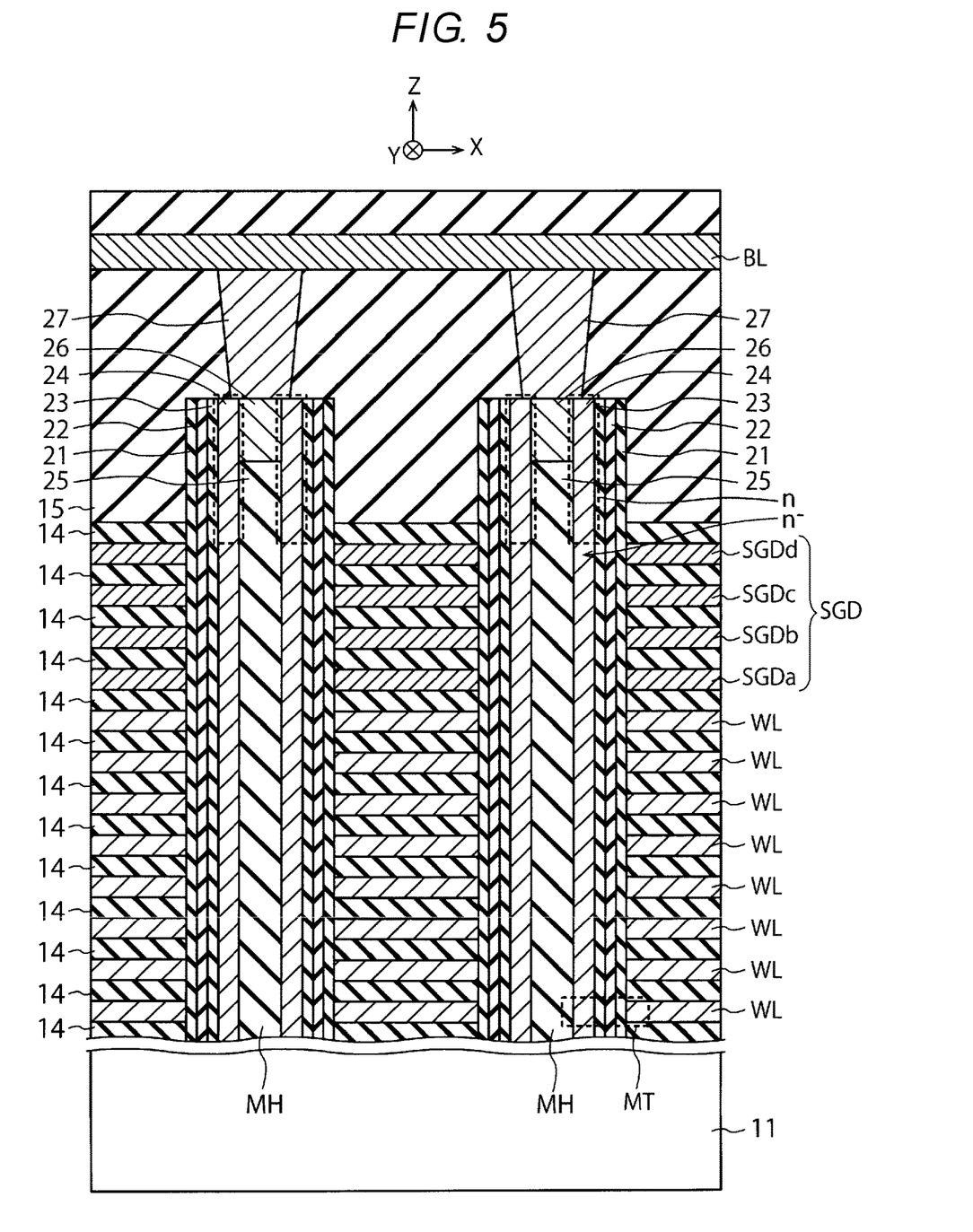
FIG. 5 is a cross-sectional view showing a structure of a semiconductor storage device according to a modification of the first embodiment.

FIG. 5 is a cross-sectional view showing a structure of a semiconductor storage device according to a modification of the first embodiment.

In addition to components shown in FIG. 4, the semiconductor storage device of the present modification includes the drain side select line SGD, an interlayer insulating film 15, an embedded semiconductor layer 26 and a contact plug 27 provided for each memory hole MH, and the bit line BL. The drain side select line SGD includes four wiring layers SGDa, SGDb, SGDc, and SGDd.

These wiring layers SGDa to SGDd are stacked on the word lines WLs to be separated from each other, similarly to the word lines WLs. The plurality of insulating layers 14 are provided between the wiring layers SGDa to SGDd. Each of the wiring layers SGDa to SGDd includes, for example, a tungsten layer. The drain side select line SGD of the present modification is electrically insulated from the channel semiconductor layer 24 in each memory hole MH.

The interlayer insulating film 15 is formed above the drain side select line SGD. The interlayer insulating film 15 is, for example, a silicon oxide film. In the present modification, each memory hole MH penetrates each insulating layer 14, each word line WL, and the wiring layers SGDa to SGDd of the drain side select line SGD. A part of each memory hole MH is formed in the interlayer insulating film 15.

In each memory hole MH, the embedded semiconductor layer 26 is formed on the core insulating film 25 and is in contact with the channel semiconductor layer 24. Above each memory hole MH, the contact plug 27 is formed on the embedded semiconductor layer 26 and is in contact with the embedded semiconductor layer 26. As a result, each of two contact plugs 27 shown in FIG. 5 is electrically or directly connected to the channel semiconductor layer 24 in a corresponding memory hole MH.

The bit line BL is formed on the contact plugs 27 in the interlayer insulating film 15. As a result, the bit line BL of the present modification is electrically connected to the channel semiconductor layer 24 in each memory hole MH.

As shown in FIG. 5, the channel semiconductor layer 24 of the present modification includes the n type diffusion layer on a side of the interlayer insulating film 15. The n type diffusion layer includes the n type impurities at a high concentration. As shown in FIG. 5, the channel semiconductor layer 24 of the present modification further includes the n− type diffusion layer on a side of the wiring layer SGDd in the drain side select line SGD. The n− type diffusion layer is located below the n type diffusion layer and includes the n type impurities such that the concentration of the n type impurities changes sharply in the −Z direction. In the present embodiment, the GIDL current can be generated by the action of the n− type diffusion layer.

In the semiconductor storage device of the present modification, the erasing voltage $V_{ERA}$ is applied to the bit line BL, and the voltage $V_{ERA\_GIDL}$ is applied to the drain side select line SGD to generate the GIDL current in a channel region of the select transistor ST1. The n− type diffusion layer shown in FIG. 5 is provided in the channel region of the select transistor ST1. The data stored in the memory cell transistor MT shown in FIG. 5 is erased by the GIDL current. In FIG. 5, the bit line BL is an example of the first wiring, and the drain side select line SGD is an example of the second wiring.

As described above, in the semiconductor storage device of the present modification, the erasing voltage $V_{ERA}$ is applied to the bit line BL instead of the source line SL, and the voltage $V_{ERA\_GIDL}$ is applied to the drain side select line SGD instead of the source side select line SGS. The erasing operation described with reference to FIG. 3 and FIG. 4 can also be implemented by a method of the present modification.

A problem described with reference to FIG. 4 can also occur even in the present modification. That is, when the concentration profile of the n type impurities in the n− type diffusion layer is significantly different for each memory hole MH, the amount of the GIDL current generated will be significantly different for each memory hole MH. Accordingly, the reliability of the erasing operation of the present modification may decrease. Therefore, the semiconductor storage device of the present modification employs the erasing operation as described with reference to FIG. 6 to FIG. 8.

Figure 7:
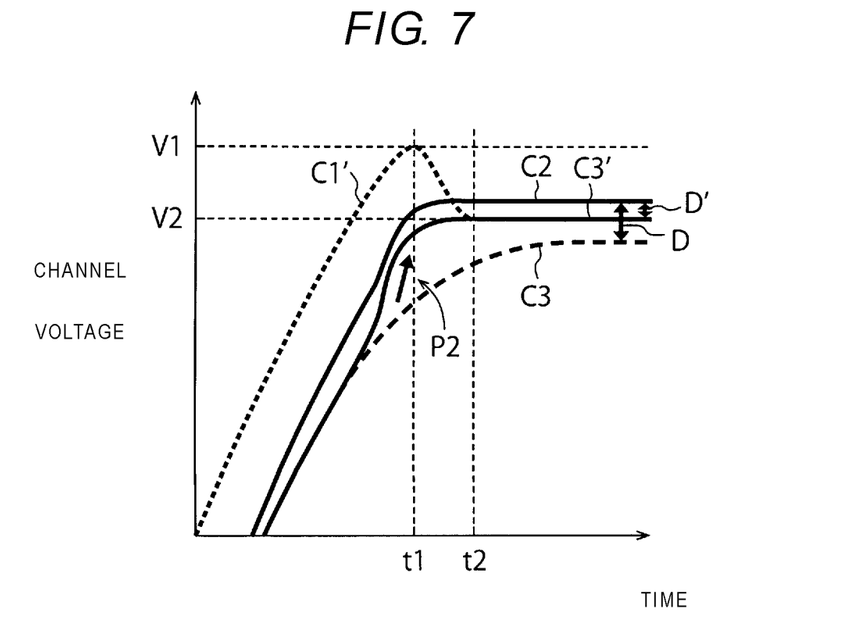
FIG. 7 is another graph showing the erasing operation according to the first embodiment.
Figure 8:
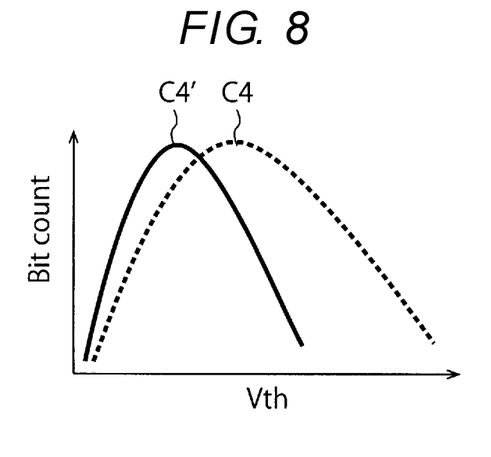
FIG. 8 is another graph showing the erasing operation according to the first embodiment.

Hereinafter, further details of the erasing operation of the first embodiment will be described with reference to FIG. 6 to FIG. 8. Contents described with reference to FIG. 6 to FIG. 8 are applicable to the modification of FIG. 5 by replacing the source line SL with the bit line BL and the source side select line SGS with the drain side select line SGD.

Figure 6:
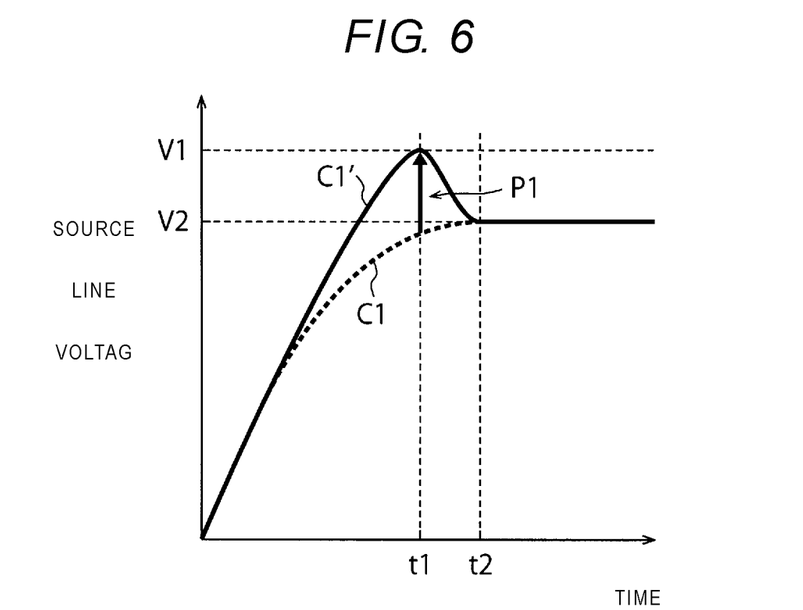
FIG. 6 is a graph showing the erasing operation according to the first embodiment.

FIG. 6 is a graph showing the erasing operation according to the first embodiment.

A curve C1 shows a time change of a source line voltage during an erasing operation of a semiconductor storage device of a comparative example of the present embodiment. A curve C1' shows a time change of a source line voltage during the erasing operation of the semiconductor storage device of the present embodiment. The semiconductor storage device of the present embodiment and the semiconductor storage device of the comparative example have substantially the same configuration, but perform different erasing operations as shown by the curves C1 and C1'.

The source line voltage during the erasing operation is the erasing voltage $V_{ERA}$ applied to the source line SL during the erasing operation. In the following description, the "source line SL", the "erasing voltage $V_{ERA}$" and other terms will be used not only in a description of the semiconductor storage device of the present embodiment but also in a description of the semiconductor storage device of the comparative example. For details of these terms, refer to the explanations of FIG. 1 to FIG. 5.

The erasing voltage $V_{ERA}$ of the present embodiment rises from zero to a value V1, falls from the value V1 to a value V2, and is maintained at the value V2 thereafter (0<V2<V1), as shown by the curve C1'. The value V1 is a maximum value of the erasing voltage $V_{ERA}$, and the value V2 is a steady value of the erasing voltage $V_{ERA}$. A reference numeral t1 indicates time when the erasing voltage $V_{ERA}$ of the present embodiment reaches the value V1, and a reference numeral t2 indicates time when the erasing voltage $V_{ERA}$ of the present embodiment converges to the value V2. As described above, the erasing voltage $V_{ERA}$ of the present embodiment temporarily reaches the maximum value V1 higher than the steady value V2, and then decreases from the maximum value V1 to the steady value V2. The value V1 is an example of a first value, and the value V2 is an example of a second value. The erasing voltage $V_{ERA}$ shown in FIG. 3 described above is, more specifically, the steady value V2.

On the other hand, the erasing voltage $V_{ERA}$ of the comparative example rises from zero to the value V2 and is maintained at the value V2 thereafter, as shown by the curve C1. A difference between the erasing voltage $V_{ERA}$ of the comparative example and the erasing voltage $V_{ERA}$ of the present embodiment is indicated by an arrow P1. A waveform of the erasing voltage $V_{ERA}$ of the present embodiment is implemented by adding a kick component that causes a voltage rise as shown by the arrow P1 to a waveform of the erasing voltage $V_{ERA}$ of the comparative example.

As described with reference to FIG. 4 and FIG. 5, when the concentration profile of the n type impurities in the n− type diffusion layer is significantly different for each memory hole MH, the amount of the GIDL current generated will be significantly different for each memory hole MH. Accordingly, the reliability of the erasing operation of the present embodiment may decrease. Therefore, in the erasing operation of the present embodiment, the erasing voltage $V_{ERA}$ that changes as shown by the curve C1' is used. Accordingly, even when the concentration profile of the n type impurities in the n− type diffusion layer is significantly different for each memory hole MH, it is possible to reduce the difference in the erasing operation between different memory holes MHs. The details will be described with reference to FIG. 7.

FIG. 7 is another graph showing the erasing operation according to the first embodiment.

FIG. 7 shows curves C2, C3, and C3' in addition to the above curve C1'. The curve C2 shows a time change of a channel voltage (a channel potential) during the erasing operation of the semiconductor storage device of the above comparative example. The curve C3 also shows the time change of the channel voltage during the erasing operation of the semiconductor storage device of the above comparative example. However, the curve C2 shows the time change of the channel voltage in the memory hole MH where the amount of the GIDL current generated is large, and the curve C3 shows the time change of the channel voltage in the memory hole MH where the amount of the GIDL current generated is small.

A curve C3' shows a time change of a channel voltage during the erasing operation of the semiconductor storage device of the present embodiment. However, the curve C3' shows the time change of the channel voltage in the memory hole MH where the amount of the GIDL current generated is small, similarly to the curve C3. The channel voltage during the erasing operation is a voltage applied to the channel semiconductor layer 24 during the erasing operation.

Here, the present embodiment and the comparative example are compared.

The channel voltage of the comparative example rises to a high steady value in the memory hole MH where the amount of the GIDL current generated is large (curve C2), but rises only to a low steady value in the memory hole MH where the amount of the GIDL current generated is small (curve C3). A reference numeral D indicates a difference between the steady value of the curve C2 and the steady value of the curve C3. As described above, during the erasing operation of the comparative example, the steady value of the channel voltage varies between the memory holes MHs. In the comparative example, when the concentration profile of the n type impurities in the n− type diffusion layer is significantly different for each memory hole MH, the amount of the GIDL current generated will be significantly different for each memory hole MH. Therefore, a variation of the channel voltage as described above occurs (see the difference D).

On the other hand, the channel voltage of the present embodiment changes as shown in the curve C2 in the memory hole MH where the amount of the GIDL current generated is large as in the comparative example, but changes as shown in the curve C3' in the memory hole MH where the amount of the GIDL current generated is small unlike the comparative example. That is, the channel voltage of the present embodiment not only rises to the high steady value in the memory hole MH where the amount of the GIDL current generated is large (curve C2), but also to the high steady value even in the memory hole MH where the amount of the GIDL current generated is small (curve C3'). A reference numeral D' indicates a difference between the steady value of the curve C2 and the steady value of the curve C3'. The difference D' is smaller than the above difference D (D'<D). As described above, according to the present embodiment, it is possible to prevent the steady value of the channel voltage from varying between the memory holes MHs during the erasing operation.

A difference between the curve C3 of the comparative example and the curve C3' of the present embodiment is indicated by an arrow P2. In the present embodiment, the erasing voltage $V_{ERA}$ temporarily rises to the maximum value V1 higher than the steady value V2. The temporary increase in the erasing voltage $V_{ERA}$ has an effect of contributing to an increase in the channel voltage in the memory hole MH where the amount of the GIDL current generated is small. The arrow P2 indicates that the curve C3 changes to the curve C3' by such an effect. Accordingly, in the present embodiment, the variation in the steady value of the channel voltage is prevented.

As described with reference to FIG. 4 and FIG. 5, when the concentration profile of the n type impurities in the n− type diffusion layer is significantly different for each memory hole MH, the amount of the GIDL current generated will be significantly different for each memory hole MH. Accordingly, the reliability of the erasing operation of the present embodiment may decrease. Therefore, in the erasing operation of the present embodiment, the erasing voltage $V_{ERA}$ that changes as shown by the curve C1' is used. Accordingly, it is possible to contribute to the increase in the channel voltage in the memory hole MH where the amount of the GIDL current generated is small, and it is possible to prevent the variation in the steady value of the channel voltage. Therefore, according to the present embodiment, even when the concentration profile of the n type impurities in the n− type diffusion layer is significantly different for each memory hole MH, it is possible to reduce the difference in the erasing operation between the different memory holes MHs. Accordingly, it is possible to improve the reliability of the erasing operation of the present embodiment.

FIG. 8 is another graph showing the erasing operation according to the first embodiment.

A curve C4 shows a relationship between a threshold voltage Vth of the memory cell transistor MT and a bit count in the above comparative example. A curve C4' shows a relationship between the threshold voltage Vth of the memory cell transistor MT and a bit count in the present embodiment. According to the present embodiment, as shown in FIG. 8, it is possible to improve a distribution of the threshold voltage Vth.

Hereinafter, further details of the erasing operation of the present embodiment will be described with reference to FIG. 6 again.

As described above, the erasing voltage $V_{ERA}$ of the present embodiment rises from zero to the value V1, falls from the value V1 to the value V2, and then is maintained at the value V2 (curve C1'). The value V1 may be set to any value as long as the value V1 is larger than the value V2. However, if the value V1 is too large, the erasing operation is fairly wasted and thus the value V1 is preferably set to twice or less of the value V2 (V1≤2×V2), for example, it is desirable to set the value to 1.1 to 1.3 times the value V2 (1.1×V2≤V1≤1.3×V2). The value of the erasing voltage $V_{ERA}$ can be measured, for example, by measuring a potential of a wiring that penetrates the insulating layer 14 or the word line WL and that is electrically connected to the source line SL as in the channel semiconductor layer 24.

Further, the erasing voltage $V_{ERA}$ of the present embodiment rises to the value V2 before the time t1, rises to the value V1 at the time t1, and falls to the value V2 after the time t1 (specifically, the time t2). Time from when the erasing voltage $V_{ERA}$ rises to the value V1 to when the voltage falls to the value V2 may be adjusted to any value, but if the time is too long, the erasing operation is fairly wasted. Therefore, it is desirable to adjust this time from 1 μs to 100 μs, for example, from several μs to several tens of μs.

The erasing voltage $V_{ERA}$ of the present embodiment is generated by, for example, the voltage generation circuit as described above. The voltage generation circuit 6 includes, for example, a pump circuit capable of switching an output voltage between the value V1 and the value V2. In this case, the semiconductor storage device of the present embodiment can apply the erasing voltage $V_{ERA}$ as shown by the curve C1' to the source line SL by switching the output voltage from the voltage generation circuit 6 between the value V1 and the value V2.

As described above, the semiconductor storage device of the present embodiment can apply the erasing voltage $V_{ERA}$ to the source line SL such that the erasing voltage $V_{ERA}$ rises to the value V1, decreases from the value V1 to the value V2, and is maintained at the value V2. Accordingly, it is possible to improve the reliability of the erasing operation for the memory cell transistor MT.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
   a plurality of memory cell transistors connected in series with each another;
   a source-side select transistor connected to one end of the plurality of memory cell transistors;
   a source-side select line electrically connected to a control terminal of the source-side select transistor;
   a source line electrically connected to a main terminal of the source-side select transistor; and
   a control circuit configured to execute an erase operation that erases data stored in the plurality of memory cell transistors by repeating one or more erasing voltage application operations, wherein
   the control circuit is configured to
      during a first erasing voltage application operation among the one or more erasing voltage application operations, apply a first voltage to the source line such that the first voltage rises from an initial value to a first value, then falls from the first value to a second value greater than the initial value at a first timing, and is then maintained at the second value, and
      during the first erasing voltage application operation, apply a second voltage smaller than the first voltage to the source-side select line at the first timing.

2. The semiconductor storage device according to claim 1, wherein
   each of the plurality of memory cell transistors includes:
      a plurality of word lines stacked above a substrate and separated from each other;
      a charge storage layer provided in the word lines; and
      a semiconductor layer provided via the charge storage layer in the word lines, and
   the source line is electrically connected to the semiconductor layer.

3. The semiconductor storage device according to claim 2, wherein
   the source line is provided between the substrate and the word lines.

4. The semiconductor storage device according to claim 2, wherein
   the source line is provided above the word lines.

5. The semiconductor storage device according to claim 1, wherein the applied first voltage rises from zero to the first value, then falls from the first value to the second value, and is then maintained at the second value.

6. The semiconductor storage device according to claim 1, wherein the first value is a maximum value of the first voltage.

7. The semiconductor storage device according to claim 1, wherein the second value is a steady value of the first voltage.

8. The semiconductor storage device according to claim 1, wherein a first instance when the first voltage reaches the first value is earlier than a second instance when the first voltage converges to the second value.

9. The semiconductor storage device according to claim 1, wherein the first value reaches a maximum value of the first voltage higher than a steady value of the first voltage, and then decreases from the maximum value to the steady value.

10. A method for controlling a semiconductor storage device, the semiconductor storage device having
    a plurality of memory cell transistors connected in series with each another;
    a source-side select transistor connected to one end of the plurality of memory cell transistors;
    a source-side select line electrically connected to a control terminal of the source-side select transistor;
    a source line electrically connected to a main terminal of the source-side select transistor,
    the method comprising:
    generating a first voltage by a control circuit; and
    executing an erase operation, by the control circuit, to erase data stored in a plurality of memory cell transistors by repeating one or more erasing voltage application operations, wherein
       during a first erasing voltage application operation among the one or more erasing voltage application operations, executing the erase operation to erase the data stored in the plurality of memory cell transistors includes applying, by the control circuit, the first voltage to the source line such that the first voltage rises from an initial value to a first value, then falls from the first value to a second value greater than the initial value at a first timing, and is then maintained at the second value, and
       the method further comprises, during the first erasing voltage application operation, applying a second voltage smaller than the first voltage to the source-side select line at the first timing.

11. The method according to claim 10, wherein the applied first voltage rises from zero to the first value, then falls from the first value to the second value, and is then maintained at the second value.

12. The method according to claim 10, wherein the first value is a maximum value of the first voltage.

13. The method according to claim 10, wherein the second value is a steady value of the first voltage.

14. The method according to claim 10, wherein a first instance when the first voltage reaches the first value is earlier than a second instance when the first voltage converges to the second value.

15. The method according to claim 10, wherein the first value reaches a maximum value of the first voltage higher than a steady value of the first voltage, and then decreases from the maximum value to the steady value.

16. A semiconductor storage device, comprising:
    a plurality of memory cell transistors connected in series with each another;
    a drain-side select transistor connected to one end of the plurality of memory cell transistors;
    a drain-side select line electrically connected to a control terminal of the drain-side select transistor;
    a bit line electrically connected to a main terminal of the drain-side select transistor; and
    a control circuit configured to execute an erase operation that erases data stored in the plurality of memory cell transistors by repeating one or more erasing voltage application operations, wherein the control circuit is configured to
   during a first erasing voltage application operation among the one or more erasing voltage application operations, apply a first voltage to the bit line such that the first voltage rises from an initial value to a first value, then falls from the first value to a second value greater than the initial value at a first timing, and is then maintained at the second value, and
   during the first erasing voltage application operation, apply a second voltage smaller than the first voltage to the drain-side select line at the first timing.

17. The semiconductor storage device according to claim 16, wherein
   each of the plurality of memory cell transistors includes:
      a plurality of word lines stacked above a substrate and separated from each other;
      a charge storage layer provided in the word lines; and
      a semiconductor layer provided via the charge storage layer in the word lines, and
   the source line is electrically connected to the semiconductor layer.

18. The semiconductor storage device according to claim 17, wherein
   the source line is provided between the substrate and the word lines.

19. The semiconductor storage device according to claim 17, wherein
   the source line is provided above the word lines.

20. The semiconductor storage device according to claim 16, wherein the applied first voltage rises from zero to the first value, then falls from the first value to the second value, and is then maintained at the second value.

21. The semiconductor storage device according to claim 16, wherein the first value is a maximum value of the first voltage.

22. The semiconductor storage device according to claim 16, wherein the second value is a steady value of the first voltage.

23. The semiconductor storage device according to claim 16, wherein a first instance when the first voltage reaches the first value is earlier than a second instance when the first voltage converges to the second value.

24. The semiconductor storage device according to claim 16, wherein the first value reaches a maximum value of the first voltage higher than a steady value of the first voltage, and then decreases from the maximum value to the steady value.

* * * * *